United States Patent [19]

Felde et al.

[11] Patent Number: 5,195,651
[45] Date of Patent: Mar. 23, 1993

[54] BALL FEEDER FOR REPLENISHING EVAPORATOR FEED

[75] Inventors: David K. Felde, Oak Ridge, Tenn.; Robert H. McKoon, San Ramon, Calif.

[73] Assignee: The United States of America as represented by the United States Department of Energy, Washington, D.C.

[21] Appl. No.: 721,009
[22] Filed: Jun. 26, 1991
[51] Int. Cl.$^5$ .............................................. B23Q 7/00
[52] U.S. Cl. ..................................... 221/174; 221/206; 221/296
[58] Field of Search ............... 221/174, 199, 206, 289, 221/290, 294, 296, 312 R; 414/146, 221, 217

[56] References Cited

U.S. PATENT DOCUMENTS

| | | | |
|---|---|---|---|
| 3,253,738 | 5/1966 | Bromley | 221/289 X |
| 3,362,580 | 1/1968 | Chambers | 221/296 X |
| 4,588,108 | 5/1986 | Knez et al. | 221/289 X |

Primary Examiner—David H. Bollinger
Attorney, Agent, or Firm—Miguel A. Valdes; Roger S. Gaither; William R. Moser

[57] ABSTRACT

Vapor source material such as uranium, which is to be dropped into a melt in an evaporator, is made into many balls of identical diameters and placed inside a container. An elongated sloping pipe is connected to the container and leads to the evaporator such that these balls can travel sequentially therealong by gravity. A metering valve in this pipe for passing these balls one at a time is opened in response to a signal when it is ascertained by a detector that there is a ball ready to be passed. A gate in the pipe near the evaporator momentarily stops the motion of the traveling ball and is then opened to allow the ball drop into the melt at a reduced speed.

6 Claims, 1 Drawing Sheet

BALL FEEDER FOR REPLENISHING EVAPORATOR FEED

BACKGROUND OF THE INVENTION

The invention described herein arose in the course of, or under, Contract No. W-7405-ENG-48 and Contract No. DE-AC05-840R21400 awarded by the United States Department of Energy.

This invention relates generally to a method of and an apparatus for supplying feedstock to an electron beam heated vaporizer so as to replenish vaporized material. More particularly, the invention relates to the supplying of uranium feedstock to a melt inside a crucible of a laser-assisted isotope separator operating in a high vacuum environment.

As shown in U.S. Pat. No. 4,262,160 issued Apr. 14, 1981 to R. McKoon and P. A. J. Smith, prior art technology for feeding uranium to a laser-assisted atomic vapor isotope separator includes the use of a series of uranium rods that are pushed into a melt-containing crucible. At the position of the crucible, each rod is heated radiatively by the melt as well as by non-primary electrons resulting from an electron beam heating the melt. As the rod is heated from one end, the solid uranium becomes liquid and drips from the heated end of the rod into the melt to replenish the supply of uranium in the crucible. With this technology, however, it is difficult to precisely control the amount of uranium being added.

SUMMARY OF THE INVENTION

It is therefore an object of the present invention to provide a method of and an apparatus for supplying feedstock to a vaporizer so as to replenish vaporized material by precisely controlling the amount of the feedstock being supplied.

It is another object of the invention to provide a ball feeder which can be used as such an apparatus.

It is still another object of the invention to provide such a ball feeder capable of dropping balls into a crucible or the like without splattering the melt therein.

It is still another object of the invention to provide such a ball feeder with which the locations at which the balls drop into the melt can be controlled in a reliable, repeatable manner.

It is still another object of the invention to provide such a ball feeder which is capable of continuous operation and is able to be re-supplied without affecting the vacuum within the evaporator.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the ball feeder of this invention may comprise a container for containing balls of identical size into which the feedstock to be supplied is formed, and an elongated pipe which is connected to this container and sloped such that these balls can roll down therealong by gravity. This elongated pipe is provided with a metering valve which serves to pass these balls only one at a time in response to a signal and a gate disposed near an outlet opening of the pipe distal from the container. The gate is normally closed and serves to momentarily stop the motion of a ball, which has passed the metering valve, before it reaches the outlet opening and is dropped therefrom into a melt-containing crucible or the like of an evaporator. A detector is provided for detecting whether a ball is present adjacent to and on the upstream side of the metering valve so as to be ready to pass the valve when it will be opened. If there is no ball there, a bridge breaker in the form of a piston can be operated to break up a bridge which may have been formed inside the container, thereby causing a jamming of the balls and preventing them to reach the metering valve. The gate may be opened by means of a solenoid and with a delay so determined that the ball coming to the position of the gate is sure to be stopped before the gate is opened and it is allowed to proceed to the outlet opening.

BRIEF DESCRIPTION OF THE DRAWING

The accompanying FIGURE, which is a schematic of a ball feeder embodying the present invention for showing its general structure, is incorporated in and forms a part of the specification and, together with the description, serves to explain the principles of the invention.

DETAILED DESCRIPTION OF THE INVENTION

Figure 1:
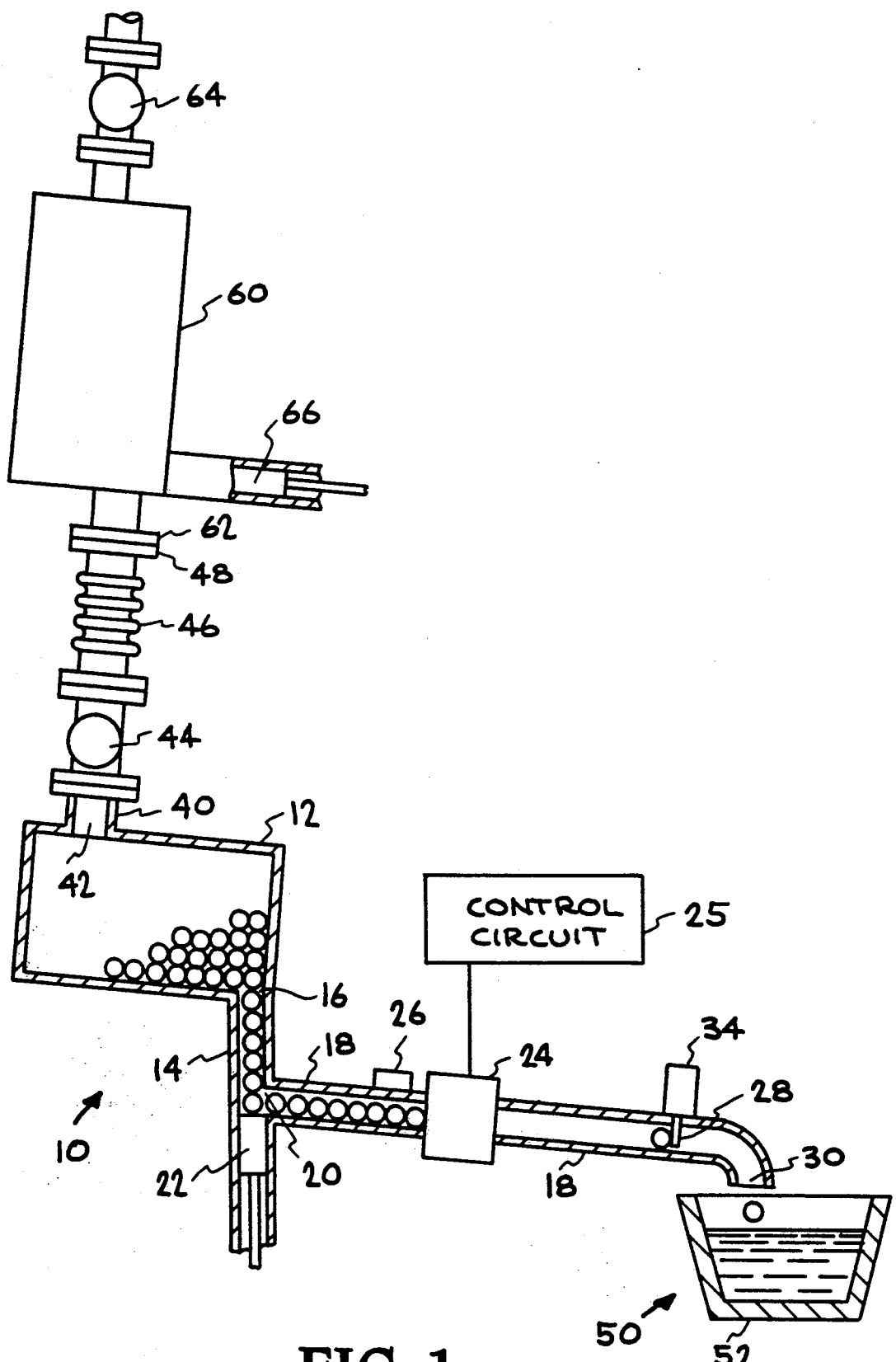

In what follows, an apparatus embodying the present invention is described. It goes without saying, however, that the description to be given below is intended to be illustrative, and not as limiting the scope of the invention.

There is shown in the FIGURE a ball feeder 10 embodying the present invention for periodically supplying to a crucible 52 of an evaporator 50 a specified amount of feed material such as uranium. The feed material of the specified amount is made into spherical balls and a large number of such balls having identical diameters are stored in a cylindrical container 12 which is slightly tipped, with its axis sloped, say, by 5 degrees from the horizontal.

A vertical pipe 14 is connected to this tipped cylindrical container 12 through an opening 16 provided at the bottom such that the balls stored inside the container 12 tend to roll toward the opening 16 by gravitational force and roll down through the opening 16 one at a time into this vertical pipe 14. An elongated sloping pipe 18, sloped by about 5 degrees, is attached to the vertical pipe 14 slightly below the opening 16. This sloping pipe 18 has an inlet opening 20 at one end and an outlet opening 30 at the other end, and is attached to the vertical pipe 14 such that its inlet opening 20 forms a connecting window opening to the vertical pipe 14. The interior diameter of the sloping pipe 18 and also that of the inlet opening 20 forming the window is only slightly greater than the size of the balls such that the balls in the vertical pipe 14 can be directed through this inlet opening 20 and slide down through the slope pipe 18.

A bridge breaker 22, in the form of a piston, is disposed vertically inside the vertical pipe 14. Its top end is normally at the bottom of the window formed by the inlet opening 20 of the sloping pipe 18 so as to prevent the balls falling down through the vertical pipe 14 from further dropping downward and to direct these balls one at a time into the interior of the sloping pipe 18.

A metering valve 24 of a known type is provided to the sloping pipe 18 at an appropriate position between its inlet and outlet openings 20 and 30 for normally serving as a closed gate to block the downward motion of the balls through the sloping pipe 18 and allowing these balls to pass therethrough one at a time in response to a control signal to open the gate. The control signal may be produced by any circuit (shown schematically in FIGURE at 25) which monitors the amount of uranium evaporated, for example, by monitoring the weight of the crucible 52 (together with the melt therein). The control circuit 25 may also be so adapted as to calculate the length of time elapsed and count the number of balls dropped during the elapsed time period. A detector 26 of a known kind such as an optical sensor is disposed adjacent to and on the upstream side (towards the inlet opening 20) of the metering valve 24. This detector 16 is for the purpose of ascertaining if there is a ball present adjacent to the metering valve 24 on its upstream side such that it can roll therethrough when a control signal is inputted to open its gate. If the detector 26 fails to detect a ball adjacent to the metering valve 24 on its upstream side, this is either because the container 12 has become empty or because the balls in the container 12 are interlocked over the opening 16 to form what is commonly referred to as "a bridge". In order to break up interlocked balls, an activating means such as a pneumatic cylinder (not shown) is operated to cause the bridge breaker 22 to move upward by a specified distance that its top end can break up the bridge and then move downward back to its original position shown in the FIGURE such that the balls from the broken-up bridge can roll down through the vertical pipe 14 and then through the inlet opening 20 of the sloping pipe 18 to reach the metering valve 24. The control signals may be produced periodically at a present frequency or by monitoring the amount of material vaporized by the evaporator 50.

The elongated sloping pipe 18 further extends from the metering valve 24 to the evaporator 50, sloped by an angle of about 5 degrees from the horizontal such that the balls, after passing through the metering valve 24 one at a time, roll therethrough by gravity towards its outlet opening 30 until they are temporarily stopped by a gate 28 disposed inside the sloping pipe 18. The purpose of this gate 28 is to prevent the incoming balls from accelerating further as they pass through the outlet opening 30 and plunging at a high velocity into the melt-containing crucible 52 of the evaporator 50. Thus, it is preferred to set the gate 28 proximally to the outlet opening 30 along the path of the balls through the sloping pipe 18.

The gate 28 is normally closed to stop the motion of an incoming ball for the purpose stated above, and is opened by a solenoid 34 which is activated with a delay of a pre-set time period after actuation of the metering valve 24 so as to insure that the ball has already reached and been stopped by the gate 28. The delay period is so selected that a ball, which has been gravitationally accelerating as it travels through the sloping pipe 18 from the metering valve 24 to the gate 28, is sure to be stopped at the gate 28. In other words, the delay time is set long enough such that the ball starts with zero velocity, when the gate 28 is opened, as it starts to resume its rolling motion towards the outlet opening 30. Since the final distance of the ball's travel through the sloping pipe 18 is short as explained above, the ball drops into the melt with very little velocity and hence the splattering of the melt due to the ball falling thereinto can be minimized. If the uranium splatter from the melt is deposited inside the sloping pipe 18, jamming of the feed balls may be caused at the outlet opening 30. Another advantage to be gained by controlling the speed of the ball near the outlet opening 30 is that the locations at which the balls drop into the melt can be controlled in a reliable, repeatable manner.

For refilling the container 12 with a fresh supply of feed balls, a supply pipe 40 is attached to the container 12 through an intake opening 42 provided on its ceiling. A vacuum isolation valve 44 is mounted on top of the supply pipe 40 and bellows 46 having a flange 48 is mounted on top of this valve 44. A fresh supply of feed balls is delivered inside a supply container 60 provided with a matching flange 62 to which si attached a sliding plate (not shown) to prevent the balls from prematurely falling out. The supply container 60 is also provided with a vacuum pump (not shown) and a bridge breaker 66 of its own. After the flanges 48 and 62 are tightly joined together, the supply container 60 is evacuated through the vacuum pump valve 64. After the supply container 60 is evacuated, the vacuum pump valve 64 is closed, the isolation valve 44 is opened, and the sliding plate at the flange 62 is opened to allow the balls to flow from the supply container 60 into the lower container 12 through the supply pipe 40. The bridge breaker 66 for the supply container 60 serves to break any bridge that may be formed inside the supply container 60 and prevent the balls from falling freely through the supply pipe 40. In this manner, an infinite quantity of balls may be supplied to the evaporator without affecting the vacuum in the separator or interrupting the operation of the electron beam.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the sloping angle of the sloping pipe 18 may be conveniently adjusted and the accompanying FIGURE is not intended to show the optimum dimensional or positional relationship of various components. The embodiment was chosen and described in order to best explain the principles of the invention and its practical application to thereby enable others skilled in the art to best utilize the invention in various embodiments and with various modifications as are suited to the particular use contemplated.

What is claimed is:
1. A ball feeder comprising:
   a container for containing balls of specified size;
   an elongated passageway means having an inlet and an outlet for allowing said balls to travel sequentially therealong by gravity from said inlet to said outlet;
   connecting means connecting said container with said inlet for causing said balls to roll out of said container and to move one by one through said passageway means from said inlet toward said outlet;
   metering valve means for metering the passage of said balls, said metering valve means being responsive to a pass signal and having an open and a closed position and disposed between said inlet and said outlet of said passageway means, wherein in said closed position said metering valve means acts to block the travel of said balls through said passageway means and wherein in said open position said metering valve means permits said balls to pass through said passageway means one at a time in response to said pass signal;

pass signal generating means for generating said pass signal and for communicating said pass signal to said metering valve means; and gate means disposed within said passageway means between said metering valve means and said outlet for momentarily stopping thereat a ball which is moving along said passageway means.

2. The ball feeder of claim 1 further comprising a gate operating means for opening said gate means to thereby allow said stopped ball to pass said gate means towards said outlet.

3. The ball feeder of claim 1 wherein said elongated passageway means comprises a pipe with inner diameter only slightly greater than the diameter of said balls, said pipe being sloped from said inlet to said outlet.

4. The ball feeder of claim 1 wherein said connecting means further comprises:

a vertical pipe connected to said container, said inlet of said passageway means opening into said vertical pipe; and a movable member having an upper end and disposed inside said vertical pipe, said upper end normally positioned immediately below said inlet, said movable member being movable upward into said container.

5. The ball feeder of claim 1 wherein said container has an intake opening provided with a vacuum isolation valve.

6. The ball feeder of claim 5 further comprising a supplying means for providing a fresh supply of balls into said container through said vacuum isolation valve without affecting the vacuum in said ball feeder.

* * * * *